United States Patent
Chuang et al.

(10) Patent No.: US 8,912,621 B1
(45) Date of Patent: Dec. 16, 2014

(54) TRENCH SCHOTTKY DEVICES

(75) Inventors: Chiao-Shun Chuang, Kaohsiung (TW); Kai-Yu Chen, Shanghai (CN); Cheng-Chin Huang, Shanghai (CN)

(73) Assignee: Diodes Incorporated, Plano, TX (US)

( * ) Notice: Subject to any disclaimer, the term of this patent is extended or adjusted under 35 U.S.C. 154(b) by 14 days.

(21) Appl. No.: 13/546,867

(22) Filed: Jul. 11, 2012

Related U.S. Application Data

(60) Provisional application No. 61/506,540, filed on Jul. 11, 2011.

(51) Int. Cl.
*H01L 29/47* (2006.01)

(52) U.S. Cl.
USPC .......................................... 257/471

(58) Field of Classification Search
CPC ..... H01L 21/28; H01L 29/78; H01L 27/0766; H01L 29/47; H01L 21/2257
USPC .............. 257/520, E21.546, E29.02, 471, 77, 257/E21.09, E29.111; 438/430, 691, 270, 438/570
See application file for complete search history.

(56) References Cited

U.S. PATENT DOCUMENTS

| | | | |
|---|---|---|---|
| 6,998,315 B2 * | 2/2006 | Hsieh et al. | 438/270 |
| 7,655,975 B2 * | 2/2010 | Hirler et al. | 257/331 |
| 2002/0102795 A1 * | 8/2002 | Calafut | 438/259 |
| 2007/0264809 A1 * | 11/2007 | Richieri | 438/580 |
| 2008/0135931 A1 * | 6/2008 | Challa et al. | 257/331 |
| 2010/0140697 A1 * | 6/2010 | Yedinak et al. | 257/334 |
| 2011/0121386 A1 * | 5/2011 | Hsieh | 257/334 |
| 2011/0198605 A1 * | 8/2011 | Wang et al. | 257/71 |
| 2011/0309470 A1 * | 12/2011 | Grebs | 257/520 |
| 2012/0256192 A1 * | 10/2012 | Zhang et al. | 257/77 |
| 2013/0001683 A1 * | 1/2013 | Pan et al. | 257/334 |

* cited by examiner

*Primary Examiner* — Jarrett Stark
*Assistant Examiner* — Shahed Ahmed (57) ABSTRACT

During fabrication of a semiconductor device, a width of semiconductor mesas between isolation trenches in the semiconductor device is varied in different regions. In particular, the width of the mesas is smaller in a termination region of the semiconductor device than in a cell or active region. When an oxide layer is subsequently grown, the semiconductor mesas between the trenches in the termination region are at least partially consumed so that the semiconductor mesas in the cell region and the termination region have different heights. Therefore, a contact photomask is not needed to isolate the semiconductor mesas in the termination region. Furthermore, after a planarization operation (such as chemical mechanical polishing), the semiconductor device may have a planar top surface than if contact holes are created. This may allow the metal layer deposited on top of the cell region and the termination region to be flat.

14 Claims, 7 Drawing Sheets

TRENCH SCHOTTKY DEVICES

CROSS REFERENCE TO RELATED APPLICATIONS

This application claims priority under 35 U.S.C. §119(e) to U.S. Provisional Application Ser. No. 61/506,540, entitled "Trench Schottky Devices," by Chiao-Sun Chuang, Kai-Yu Chen, and Cheng-Chin Huang, filed on Jul. 11, 2011, the contents of which are herein incorporated by reference.

BACKGROUND

1. Field

The present disclosure relates to techniques for designing semiconductor devices. More specifically, the present disclosure relates to a semiconductor device with a trench Schottky diode in which the top surface of the semiconductor layer in the cell region has a different height than the top surface of the semiconductor layer in the adjacent termination region.

2. Related Art

Schottky diodes are often used as rectifiers in power supplies. Trench Schottky diodes, in which parallel trenches in a cell or active region are used to provide isolation and to enhance depletion when the Schottky diodes are reversebiased, are often used to improve performance with respect to conventional Schottky diodes. In particular, trench Schottky diodes usually have improved forward voltage drop and reverse leakage current, which reduces forward losses and increases the maximum junction temperature. These improved characteristics reduce heat dissipation and enhance the safety margin of trench Schottky diodes.

Typically, trench Schottky diodes are fabricated using at least three photomasks in a photolithographic process. For example, a trench photomask, a contact photomask and a metal photomask may be used to define the structures in different layers in a trench Schottky diode. However, the use of multiple photomasks increases the cost of fabricating trench Schottky diodes and can reduce the yield.

Hence, what is needed is a semiconductor device, such as a trench Schottky diode, without the above-described problems.

SUMMARY

One embodiment of the present disclosure provides a semiconductor device. This semiconductor device includes a substrate and a semiconductor layer disposed on the substrate. The semiconductor layer includes trenches, defined by inner surfaces, in a cell region, and adjacent trenches are separated by the semiconductor layer. Moreover, a top surface of the semiconductor layer in the cell region is higher than a top surface of the semiconductor layer in a termination region, which is adjacent to the cell region.

In some embodiments, the semiconductor device includes an oxide layer disposed on the inner surfaces of the trenches in the cell region and on the top surface of the semiconductor layer in the termination region. Furthermore, a second semiconductor layer may be disposed on the oxide layer in the trenches, and a metal layer may be disposed on top surfaces of the semiconductor layer, the oxide layer and the second semiconductor layer in the cell region and may be disposed on a top surface of the oxide layer in the termination region. Note that the top surfaces of the semiconductor layer, the oxide layer and the second semiconductor layer in the cell region and the top surface of the oxide layer in the termination region may be substantially planar so the metal layer is substantially flat. For example, the metal layer may be planar within the limitations set by an etch-back process.

In some embodiments, the second semiconductor layer includes polysilicon. Moreover, the semiconductor layer may include silicon and/or silicon carbide. Furthermore, the oxide layer may include silicon dioxide.

Additionally, in the cell region, the metal layer and the semiconductor layer between the trenches may form a Schottky diode.

Note that the trenches may be parallel to each other across a width of the semiconductor device. Moreover, across the width of the semiconductor device, the trenches may be divided into islands, and adjacent islands may be separated by the semiconductor layer. For example, the islands may have a square shape or a rectangular shape.

Another embodiment provides a system that includes the semiconductor device.

Another embodiment provides a method for fabricating the semiconductor device. During the method, the trenches having the inner surfaces are defined in the semiconductor layer, where there is the first width of the semiconductor layer between adjacent trenches in the cell region of the semiconductor device and the second width of the semiconductor layer between adjacent trenches in the termination region of the semiconductor device, and where the first width is larger than the second width. Then, an oxide layer is grown on the semiconductor layer and the inner surfaces of the trenches, where the oxide layer consumes the semiconductor layer between the adjacent trenches in the termination region. Moreover, the second semiconductor layer is deposited on the oxide layer in the trenches. Furthermore, top surfaces of the semiconductor layer, the oxide layer and the second semiconductor layer in the cell region, and the oxide layer in the termination region are planarized to define a substantially planar surface. Next, the metal layer is deposited on the planar surface in the cell region and the termination region.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of a semiconductor device, a system that includes the semiconductor device, and a method for fabricating the semiconductor device are described. During fabrication, a width of semiconductor mesas between isolation trenches in the semiconductor device is varied in different regions. In particular, the width of the mesas is smaller in a termination region of the semiconductor device than in a cell or active region. When an oxide layer is subsequently grown, the semiconductor mesas between the trenches in the termination region are at least partially consumed so that the semiconductor mesas in the cell region and the termination region have different heights. Therefore, a contact photomask is not needed to isolate the semiconductor mesas in the termination region. Furthermore, after a planarization operation (such as chemical mechanical polishing), the semiconductor device may have a more planar top surface than if contact holes are created. This may allow the metal layer deposited on top of the cell region and the termination region to be flat.

By eliminating a photomask during the fabrication of the semiconductor device, this fabrication technique reduces the manufacturing cost and increases the yield of the integrated circuit.

We now describe embodiments of the semiconductor device. As noted above, and described further below with reference to FIGS. 4-7, one or more semiconductor devices (such as trench Schottky diodes) may be fabricated using a reduced number of photomasks than in a conventional fabrication technique. In particular, a contact photomask may not be needed to define the termination region (and thus the extent of the cell or active region in each of the semiconductor devices). Instead, a trench photomask may be used to define different semiconductor mesa widths or pitches in the cell region and the termination region. After the oxide is grown, most or all of the semiconductor (such as silicon) in the mesas between the trenches in the termination region can be consumed (so a contact photomask is not needed to remove it), while in the cell region there is sufficient semiconductor between the trenches to subsequently form trench Schottky diodes. In some embodiments, after planarization (such as chemical mechanical polishing with the semiconductor layer as a polish stop), a metal photomask is used to define a flat metal layer in the cell region and the termination region. However, note that a wet or dry etch that stops short of the shorter semiconductor mesas in the termination region can also be used.

The resulting semiconductor devices have a distinct cross-section relative to those produced using the conventional fabrication technique. Notably, the top surface of the semiconductor layer in the cell region may be higher than the top surfaces of the semiconductor layer in the termination region. Moreover, in some embodiments the metal layer on top of the semiconductor devices does not have topographical variations, such as those found proximate to a transition between the cell region and the termination region in the semiconductor devices produced using the conventional fabrication technique.

Figure 1:
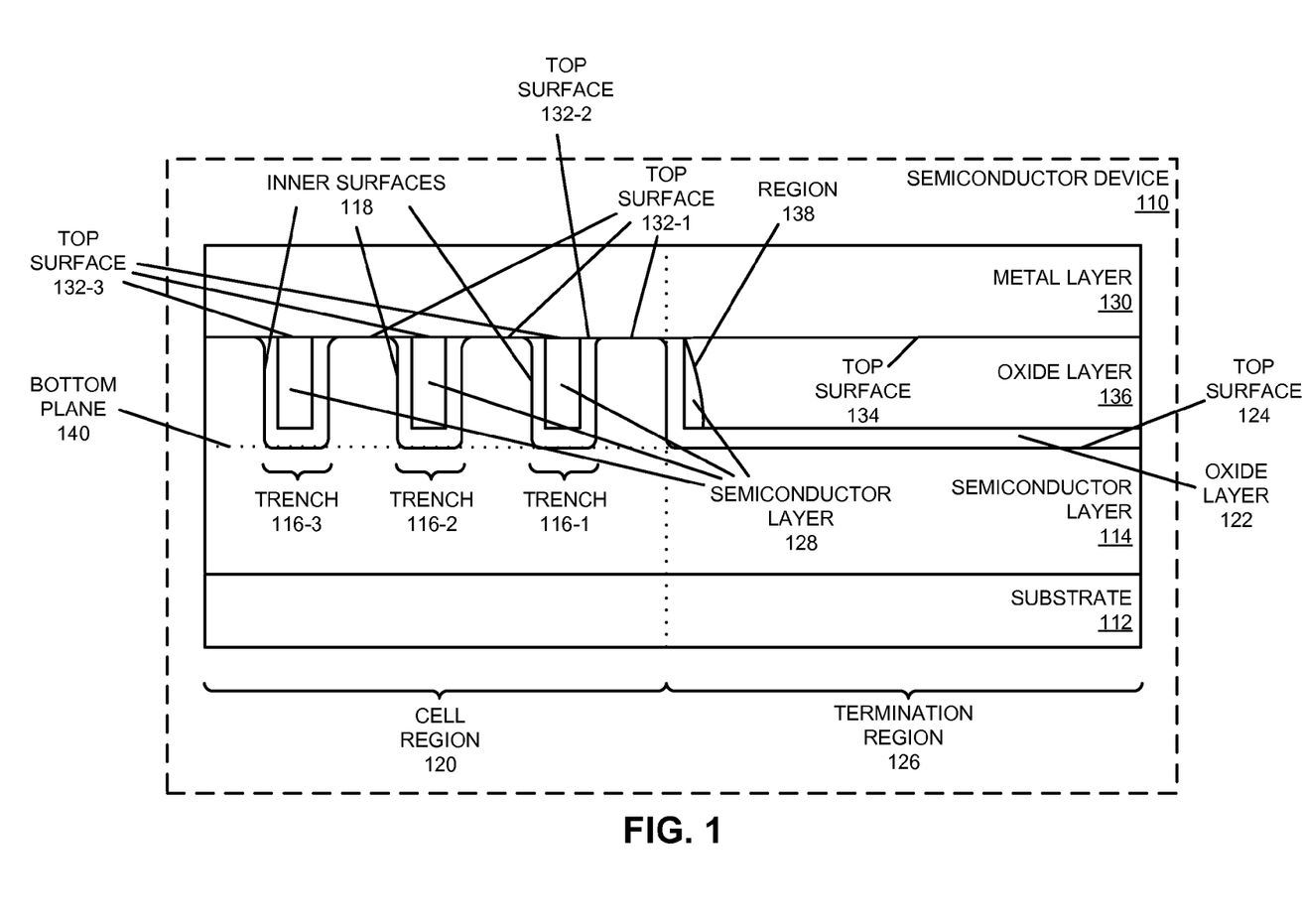
FIG. 1 is a block diagram illustrating a side view of a semiconductor device in accordance with an embodiment of the present disclosure.

The distinct cross-section of the semiconductor device is shown in FIG. 1, which presents a block diagram illustrating a side view of semiconductor device 110. This semiconductor device includes a substrate 112 and a semiconductor layer 114 disposed on substrate 112. Trenches 116, defined by inner surfaces 118, are etched or cut into semiconductor layer 114 in a cell region 120, and adjacent trenches (such as trenches 116-1 and 116-2) are separated by semiconductor layer 114 (this semiconductor material separating adjacent trenches is sometimes referred to as a 'mesa'). Moreover, the mesas in cell region 120 may have a different height than a height of the mesas in termination region 126, which is adjacent to cell region 120. As a consequence, top surface 132-1 of semiconductor layer 114 in cell region 120 is higher than a top surface 124 of semiconductor layer 114 in termination region 126. Stated differently, the mesas in semiconductor layer 114 may have a common bottom plane 140 in cell region 120 and termination region 126 even though top surfaces 132-1 and 124 are different.

In some embodiments, an oxide layer 122 is disposed on inner surfaces 118 of trenches 116 in cell region 120 and on top surface 124 of semiconductor layer 114 in termination region 126. For example, oxide layer 122 may be grown using chemical vapor deposition. Subsequently, oxide layer 136 may be deposited on oxide layer 122. Furthermore, a semiconductor layer 128 (such as polysilicon) may be disposed on oxide layer 122 in trenches 116, and a metal layer 130 (such as aluminum/copper) may be disposed on top surfaces 132 of semiconductor layer 114, oxide layer 122 and semiconductor layer 128 in cell region 120, and may be disposed on a top surface 134 of oxide layer 122 in termination region 126. Note that top surfaces 132 of semiconductor layer 114, oxide layer 122 and the semiconductor layer 128 in cell region 120, and top surface 134 of oxide layer 122 in termination region 126 may be substantially planar (because of the chemical mechanical polishing, wet etching and/or dry etching) so metal layer 130 may be substantially flat. For example, metal layer 130 may be planar within the limitations set by an etch-back process.

In an exemplary embodiment, semiconductor layer 114 includes silicon and/or silicon carbide. More generally, a wide variety of semiconductors may be used. Furthermore, oxide layers 122 and/or 136 may include silicon dioxide.

Additionally, in cell region 120, metal layer 130 and semiconductor layer 114 between trenches 116 may form a Schottky diode (such as a trench Schottky diode). In particular, the tops of the mesas in semiconductor layer 114 in cell region 120 (i.e., top surface 132-1) form the Schottky diode with metal layer 130. Because termination region 126 is used to maintain a high breakdown voltage in the Schottky diode, oxide layers 122 and/or 136 are used to prevent shorting of top surface 124 to metal layer 130. The fabrication technique used to fabricate semiconductor device 110 allows this isolation to be implemented without using a contact photomask.

Note that oxide layer 122 may have a thickness of at least 2500 Å. During fabrication, this oxide may consume approximately 1200 Å of the semiconductor in semiconductor layer 114. As a consequence, when deposited or grown, a width of the semiconductor in semiconductor layer 114 between trenches 116 in cell region 120 may be wider than 3000 Å so that sufficient semiconductor remains after oxide layer 122 is fabricated to form the Schottky diode. In some embodiments, semiconductor layer 128 has a thickness of 2500 Å. In these embodiments, oxide layer 136 may have a thickness of 2500 Å.

Figure 2:
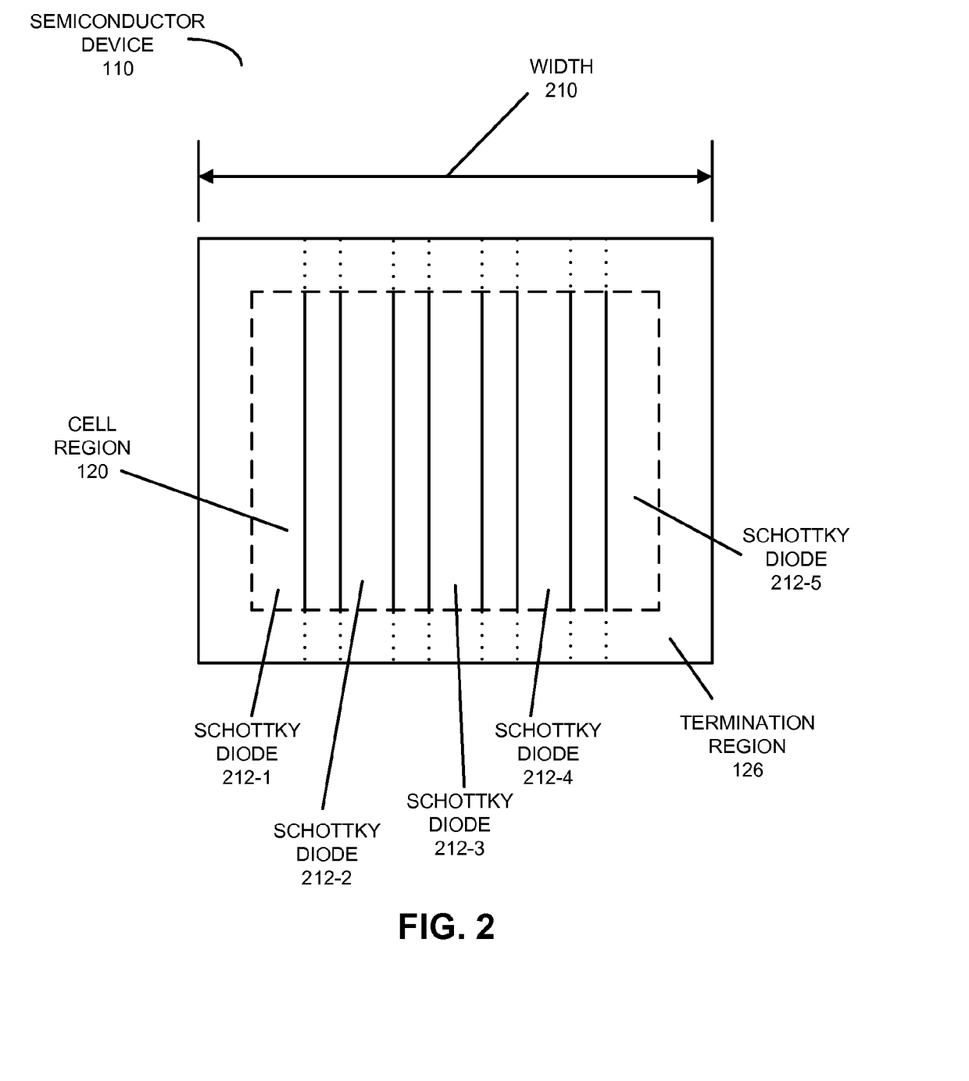
FIG. 2 is a block diagram illustrating a top view of the semiconductor device of FIG. 1 in accordance with an embodiment of the present disclosure.
Figure 3:
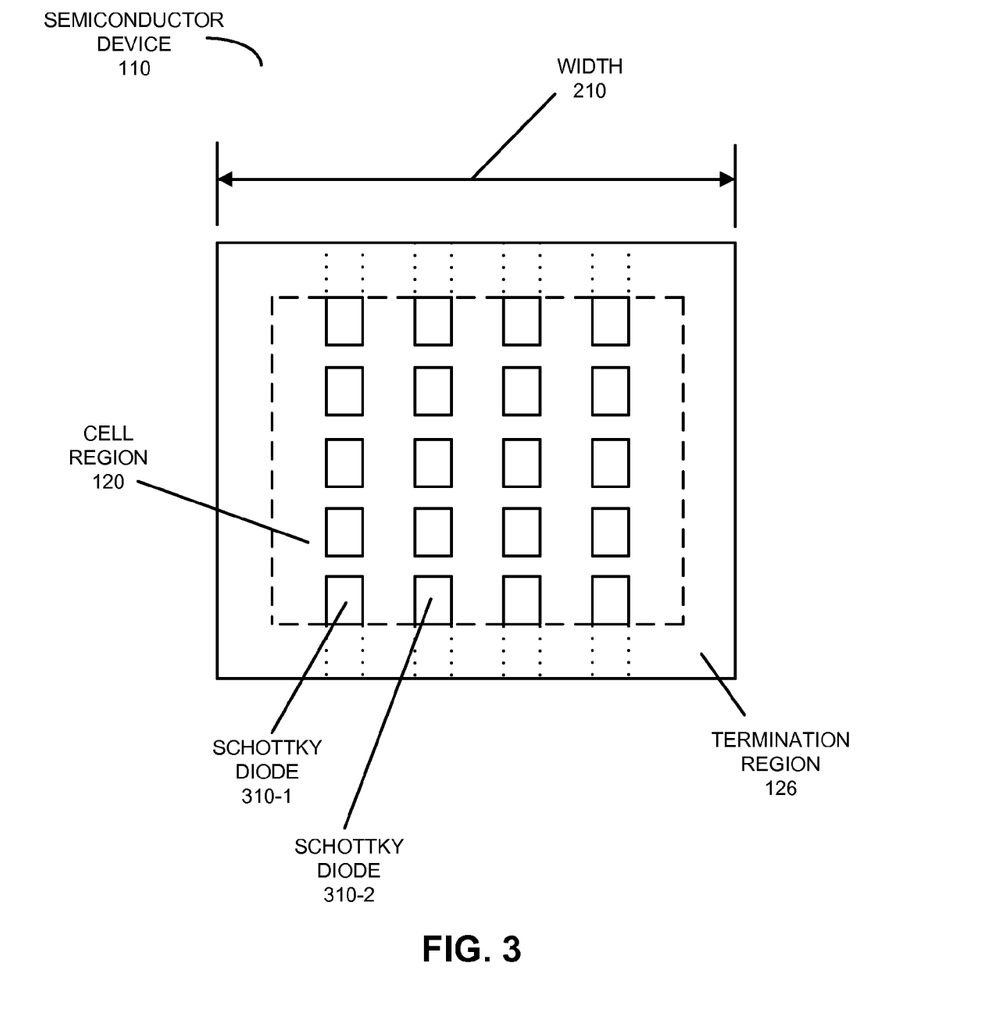
FIG. 3 is a block diagram illustrating a top view of the semiconductor device of FIG. 1 in accordance with an embodiment of the present disclosure.

As shown in FIG. 2, which presents a block diagram illustrating a top view of semiconductor device 110, trenches 116 (FIG. 1) may be parallel to each other across a width 210 of semiconductor device 110 so that isolated Schottky diodes 210 are produced in cell region 120. Note that the residual trenches in termination region 126 are illustrated in FIG. 2 (and in FIG. 3) by the dotted lines. Moreover, as shown in FIG. 3, which presents a block diagram illustrating a top view of semiconductor device 110, across width 210 of semiconductor device 110, in some embodiments trenches 116 (FIG. 1) are divided into islands, and adjacent islands are separated by semiconductor layer 114 in FIG. 1. For example, the islands may have a square shape or a rectangular shape. This approach may produce island-like Schottky diodes 310 in cell region 120.

Using stripes (FIG. 2) or islands 310 may enhance the depletion effect when the Schottky diode is reverse-biased. For example, islands 310 may provide isolation in the x and y directions in a plane of semiconductor device 110.

Figure 4:
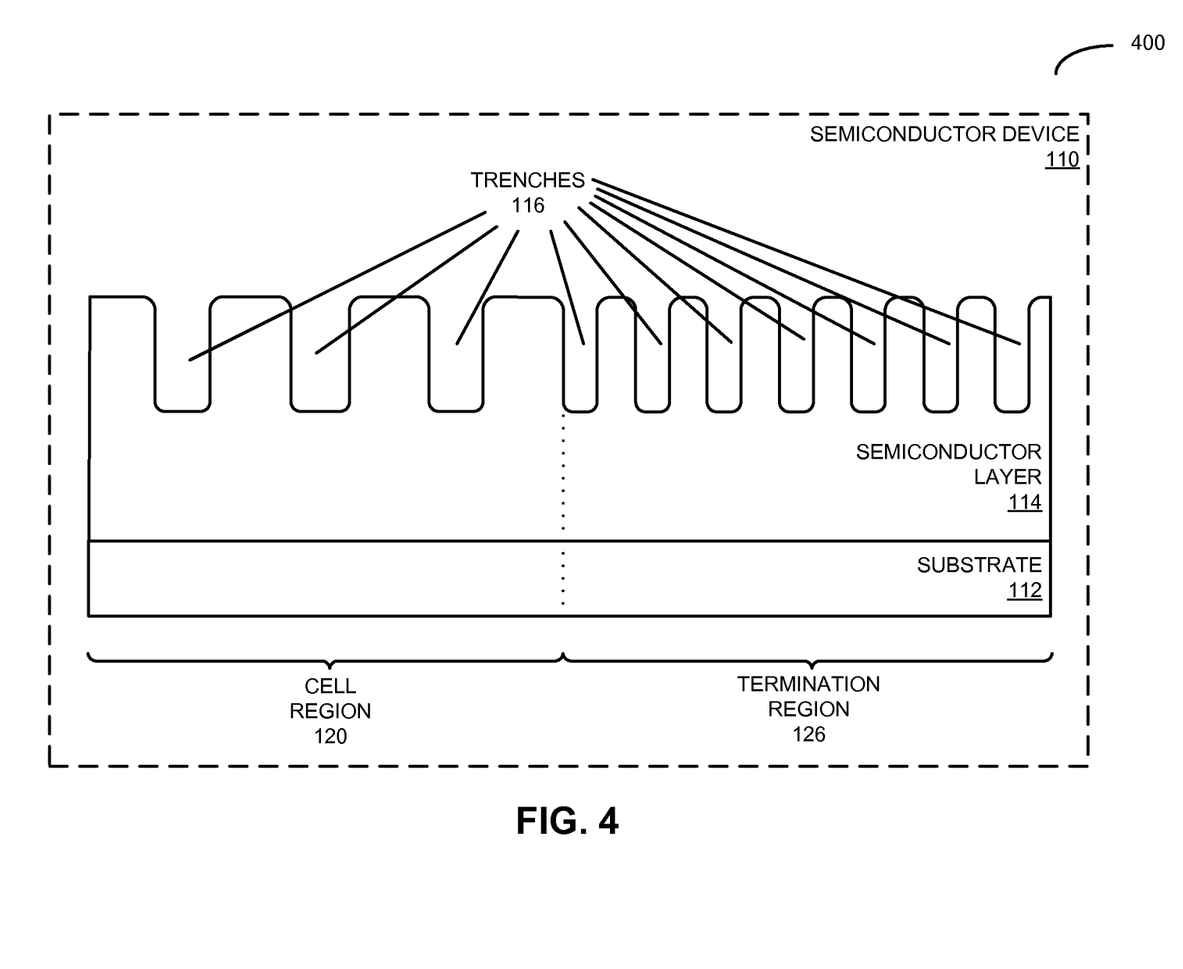
FIG. 4 is a flow diagram illustrating a method for fabricating a semiconductor device in accordance with an embodiment of the present disclosure.
Figure 5:
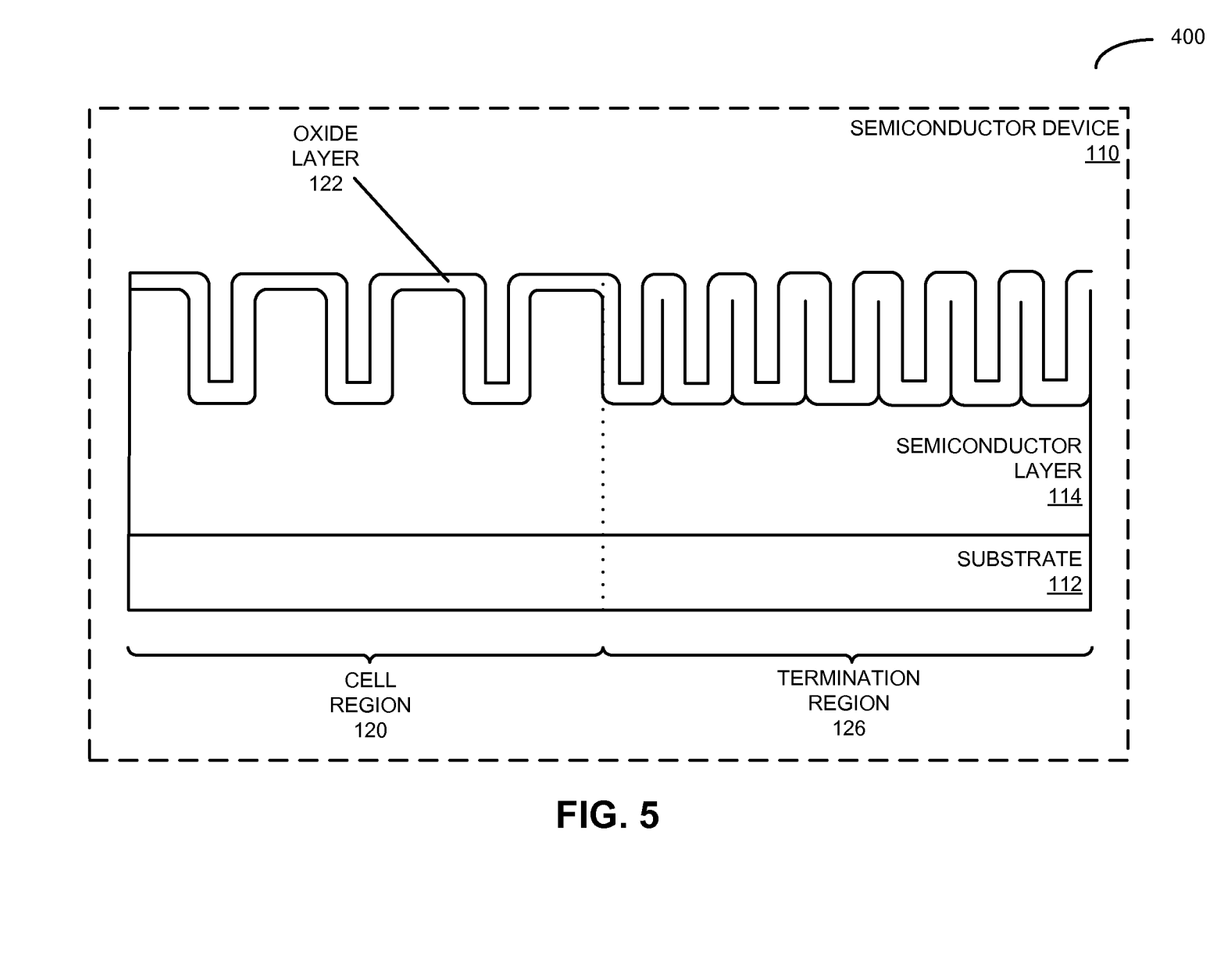
FIG. 5 is a flow diagram illustrating the method of FIG. 4 in accordance with an embodiment of the present disclosure.
Figure 6:
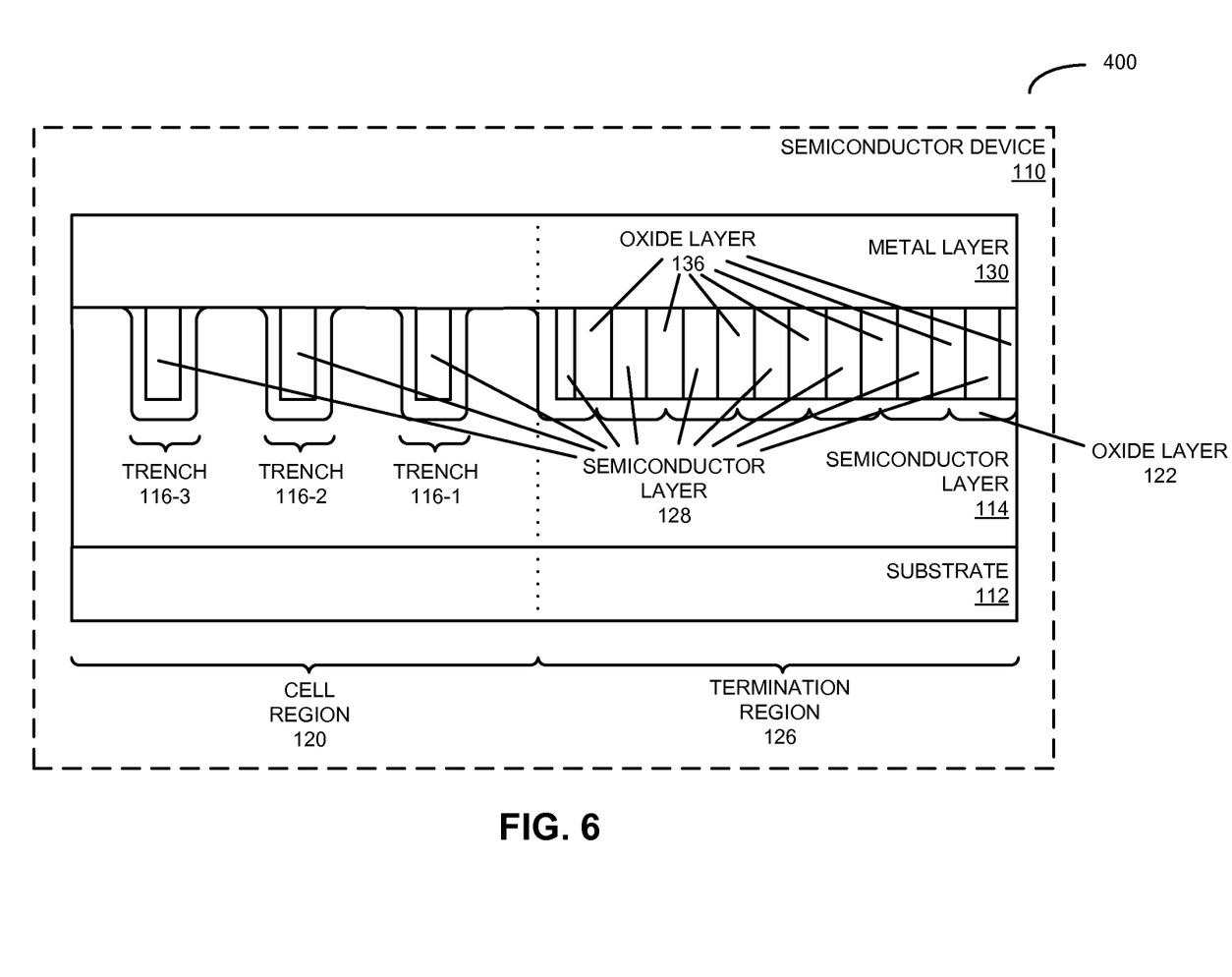
FIG. 6 is a flow diagram illustrating the method of FIG. 4 in accordance with an embodiment of the present disclosure.

We now describe embodiments of the method. FIGS. 4-6 presents flow diagrams illustrating a method 400 for fabricating a semiconductor device. In this method, the width of the semiconductor mesas in the termination region is narrowed so that the semiconductor near the top surface of the semiconductor layer is consumed during an oxidation process. As a consequence, the height of the mesas in these regions is reduced relative to the height of the mesas in the cell region. Furthermore, the top surfaces of these semiconductor mesas are covered by the oxide layer, and therefore do not form a Schottky diode with the metal layer. In the example shown in FIG. 1, chemical mechanical polishing was used to control the selective exposure of the top surfaces of the mesas, but a variety of techniques (such as wet etching, dry etching, an oxide etch, etc.) can be used in a controlled manner so that the exposed semiconductor layer in the termination region is not over-etched. In the discussion that follows, different semiconductor mesa widths or pitches in the termination region and growth of the oxide layer without subsequent chemical mechanical polishing is used to eliminate Schottky diodes in the termination region. This approach may also allow the contact photomask (which is often used in existing fabrication techniques to define the termination region) to be eliminated from the fabrication technique.

As shown in FIG. 4, a different mesa width or pitch is used in cell region 120 and termination region 126. Then, as shown in FIG. 5, after oxide layer 122 is deposited or grown, the mesas in termination region 126 are consumed or merged so that oxide layer 122 will separate semiconductor layer 114 from metal layer 130 (FIG. 1). Next, as shown in FIG. 6, after depositing the polysilicon and oxide layer 136, performing chemical mechanical polishing (and, more generally, planarization) of the top surfaces and an optional silicon etch operation, metal layer 130 is deposited. Note that a residual of the semiconductor mesas in still present at the bottom of oxide layer 122 in termination region 126.

In some embodiments, method 400 may involve the following operations: using a trench photomask to define trenches 116 in epitaxial semiconductor layer 114 and then etching trenches 116; after removing the sacrificial oxide, depositing or growing a thick field oxide layer, such as oxide layer 122 and/or 136 (for example, a 4000 Å thick oxide layer); depositing polysilicon using chemical vapor deposition followed by blank polysilicon etching; depositing an interlayer-dielectric using chemical vapor deposition, performing reflow, performing interlayer-dielectric blank etching or chemical mechanical polishing, and performing silicon etching; and using a metal photomask to define metal layer 130 (such as titanium/titanium nitride for barrier layer and aluminum/copper for the metal layer). Note that the silicon etch operation may help ensure that high quality Schottky diodes are formed with metal layer 130. Also note that a laser cut or a die saw may be used to cut the metal of adjacent dies so that the metal mask also can be removed.

Figure 7:
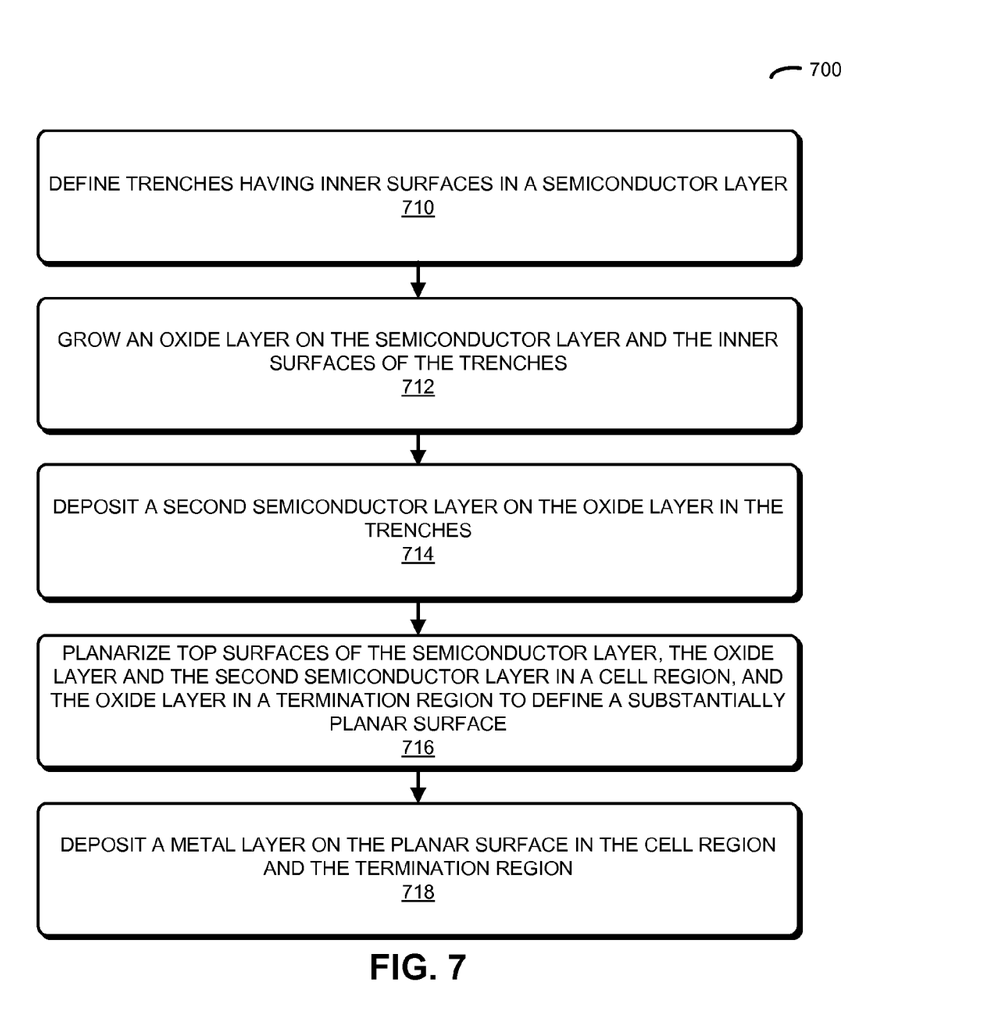
FIG. 7 is a flow diagram illustrating a method for fabricating the semiconductor device of FIG. 1 or 4-6 in accordance with an embodiment of the present disclosure.

FIG. 7 presents a flow diagram illustrating a method 700 for fabricating semiconductor device 110 (FIG. 1) or the semiconductor device illustrated in FIGS. 4-6. During this method, the trenches having the inner surfaces are defined in the semiconductor layer (operation 710), where there is the first width of the semiconductor layer between adjacent trenches in the cell region of the semiconductor device and the second width of the semiconductor layer between adjacent trenches in the termination region of the semiconductor device, and where the first width is larger than the second width. Then, an oxide layer is grown on the semiconductor layer and the inner surfaces of the trenches (operation 712), where the oxide consumes the semiconductor layer between the adjacent trenches in the termination region. Moreover, the second semiconductor layer is deposited on the oxide layer in the trenches (operation 714). Furthermore, top surfaces of the semiconductor layer, the oxide layer and the second semiconductor layer in the cell region, and the oxide layer in the termination region are planarized to define a substantially planar surface (operation 716). Next, the metal layer is deposited on the planar surface in the cell region and the termination region (operation 718).

In some embodiments of methods 400 (FIGS. 4-6) and/or 700 there are additional or fewer operations. For example, instead of having multiple trenches with different widths in the termination region and the cell region, in some embodiments the termination region includes a single, large trench. This embodiment of the fabrication technique may result in the cross-section of the semiconductor device illustrated in FIG. 1. Moreover, the order of the operations may be changed, and/or two or more operations may be combined into a single operation.

The semiconductor device may be used in a variety of applications. For example, the semiconductor device may be included in a system, such as: a VLSI circuit, a switch, a hub, a bridge, a router, a communication system (such as a wavelength-division-multiplexing communication system), a storage area network, a data center, a network (such as a local area network), a power supply (such as a switched-mode power supply) and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a portable-computing device, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device. Note that a given computer system may be at one location or may be distributed over multiple, geographically dispersed locations.

Furthermore, the embodiments of the semiconductor device and/or the system may include fewer components or additional components. Although these embodiments are illustrated as having a number of discrete items, the semiconductor device and the system are intended to be functional descriptions of the various features that may be present rather than structural schematics of the embodiments described herein. Consequently, in these embodiments two or more components may be combined into a single component, and/or a position of one or more components may be changed. In addition, functionality in the preceding embodiments of the semiconductor device and/or the system may be implemented more in hardware and less in software, or less in hardware and more in software, as is known in the art.

While particular semiconductor-manufacturing process operations were used as illustrations in the preceding discussion, a wide variety of fabrication techniques and operations may be used, as is known to one of skill in the art. Moreover, while the preceding discussion illustrated the semiconductor device is a discrete component, in some embodiments the semiconductor device is included in an integrated circuit.

An output of a process for designing the semiconductor device, or a portion of the semiconductor device described herein may be a computer-readable medium such as, for example, a magnetic tape or an optical or magnetic disk. The computer-readable medium may be encoded with data structures or other information describing circuitry that may be physically instantiated as the semiconductor device or portion of the semiconductor device. Although various formats may be used for such encoding, these data structures are commonly written in Caltech Intermediate Format (CIF), Calma GDS II Stream Format (GDSII) or Electronic Design Interchange Format (EDIF). Those of skill in the art of integrated circuit design can develop such data structures from schematic diagrams of the type detailed above and the corresponding descriptions and encode the data structures on a computer-readable medium. Those of skill in the art of integrated circuit fabrication can use such encoded data to fabricate one or more of the semiconductor devices described herein.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A semiconductor device, comprising:
a substrate; and
a semiconductor layer disposed on the substrate, wherein the semiconductor layer includes trenches in a cell region and in a termination region;
wherein adjacent trenches in the cell region are filled with polysilicon and separated by the semiconductor layer, and adjacent trenches in the termination region are filled with polysilicon and separated by an oxide layer; and
a continuous metal layer covering the trenches in the cell region and trenches in the termination region, contacting the semiconductor layer and the polysilicon in the trenches in the cell region, and contacting the polysilicon in adjacent trenches in the termination region.

2. The semiconductor device of claim 1, wherein, in the cell region, the metal layer and the semiconductor layer between the trenches form a Schottky diode.

3. The semiconductor device of claim 1, wherein the trenches are parallel to each other across a width of the semiconductor device.

4. The semiconductor device of claim 1, wherein, across a width of the semiconductor device, the trenches are divided into islands; and wherein adjacent islands are separated by the semiconductor layer.

5. The semiconductor device of claim 3, wherein the islands have a square shape.

6. The semiconductor device of claim 3, wherein the islands have a rectangular shape.

7. A semiconductor device, comprising:
a semiconductor layer having a termination region and a cell region,
a plurality of trenches in the termination region filled with polysilicon;
a continuous metal layer covering the trenches and contacting the polysilicon in the trenches; and
an oxide layer separating the trenches and electrically isolating the semiconductor layer from the continuous metal layer.

8. The semiconductor device of claim 7, further comprising a plurality of trenches in the cell region.

9. The semiconductor of claim 7, in which the plurality of trenches are filled with polysilicon.

10. The semiconductor of claim 7, in which the plurality of trenches are separated by a plurality of mesas of the semiconductor layer.

11. The semiconductor of claim 10, in which the continuous meal layer is in contact with the plurality of mesas and the polysilicon in the cell region.

12. The semiconductor of claim 11, further comprising Schottky diodes at the contacts between the continuous metal layer and the mesas.

13. The semiconductor device of claim 8, wherein some trenches have rectangular shape.

14. The semiconductor device of claim 8, wherein some trenches have square shape.

* * * * *